United States Patent [19]
Runyon

[11] Patent Number: 5,438,749
[45] Date of Patent: Aug. 8, 1995

[54] METHOD OF MAKING A FLEX CIRCUIT INTERCONNECT FOR A MICROPROCESSOR EMULATOR AND A METHOD OF TESTING

[75] Inventor: Ronnie J. Runyon, Kokomo, Ind.

[73] Assignee: Delco Electronics Corp., Kokomo, Ind.

[21] Appl. No.: 114,861

[22] Filed: Sep. 2, 1993

[51] Int. Cl.$^6$ .................................... H01R 43/00
[52] U.S. Cl. .................................... 29/825; 29/593; 228/180.21; 324/754
[58] Field of Search .............. 29/827, 840, 843, 825, 29/593; 324/754, 761, 537; 174/254; 228/180.21

[56] References Cited

U.S. PATENT DOCUMENTS

| | | | |
|---|---|---|---|
| 4,195,195 | 3/1980 | de Miranda et al. | 174/254 |
| 4,611,746 | 9/1986 | Levine et al. | 228/180.21 |
| 4,867,715 | 9/1989 | Roth et al. | 439/876 |
| 4,939,452 | 7/1990 | Reinholz | 324/754 |
| 4,968,589 | 11/1990 | Perry | 324/754 |
| 5,288,950 | 2/1994 | Ushio et al. | 174/254 |

OTHER PUBLICATIONS

Goodykoontz, J. R., "A Universal Printed Circuit", Tele-Tech & Electronic Industries, Dec. 1954, p. 74.

*Primary Examiner*—P. W. Echols
*Attorney, Agent, or Firm*—Mark A. Navarre

[57] ABSTRACT

An interconnect device and method is provided for establishing communications between an electronic circuit board and a microprocessor emulator, so as to permit the evaluation or testing of an electronic circuit or system without a microprocessor flip chip or an integrated circuit socket being present on the circuit board. The flexible interconnect device serves to electrically connect the emulator to the individual conductors which compose a microprocessor flip chip conductor pattern formed on the electronic circuit board. The method involves a reflow soldering technique which bonds the flexible interconnect device to the microprocessor flip chip conductor pattern on the electronic circuit board, so as to form a reliable electrical connection between the flexible interconnect device and the circuit board.

13 Claims, 2 Drawing Sheets

METHOD OF MAKING A FLEX CIRCUIT INTERCONNECT FOR A MICROPROCESSOR EMULATOR AND A METHOD OF TESTING

The present invention generally relates to electronic interconnect devices used to provide a communications path between electronic circuits. More particularly, this invention relates to a flexible circuit interconnect device which permits a flip chip microprocessor conductor pattern on a circuit board to be interconnected to a microprocessor emulator, so as to enable evaluation and testing of other circuit devices on the board without the flip chip microprocessor being physically present on the circuit board.

BACKGROUND OF THE INVENTION

As is well known in the art, microprocessors are large scale integrated circuit devices. A microprocessor chip may contain the control unit, central processing circuitry, and arithmetic and logic circuitry for a computer, permitting its use as a single-chip computer component. As such, microprocessors generally constitute the primary computer element for a computer. Numerous circuit devices are necessary to assist the microprocessor in its function, such as memory chips (RAM and ROM), input-output chips, as well as conventional electrical devices such as diodes, capacitors, inductors and resistors. However, the microprocessor chip will typically be the most expensive single device on a circuit board.

Microprocessor chips are typically soldered to their circuit board, such as a ceramic substrate or printed wiring board. Due to the numerous functions performed by microprocessors, a relatively large number of terminals are required. The size of a typical microprocessor chip is generally on the order of a few millimeters per side, making it somewhat difficult to mount a microprocessor chip to its circuit board. A conventional method adopted by the industry is the flip-chip bonding process. This process utilizes a microprocessor chip referred to as a flip chip, which is generally a monolithic semiconductor device having bead-like terminals provided on one face of the chip. The terminals serve as connections between the microprocessor chip and a suitable conductor pattern formed on the circuit board. Flip chip conductor patterns are composed of numerous individual conductors, often as small as about 0.006 inch in width, and spaced about 0.008 inch apart. As a result, soldering a microprocessor flip chip to its conductor pattern requires a significant degree of precision.

Generally, early in the development of a microprocessor-based product which uses a microprocessor flip chip, the software code required for the fabrication of the production flip chip is not yet established. Consequently, for development purposes the production flip chip's software is typically simulated with a microprocessor emulator, such as a programmable, prepackaged integrated circuit. To do so, a substrate designer is required to design an engineering development unit with an integrated circuit socket mounted to the unit's substrate. A programmable, prepackaged integrated circuit can then be inserted into the socket, by which simulations can be performed for software development.

Unfortunately, integrated circuit sockets are generally many times larger than a microprocessor flip chip, such that an engineering development unit will be much larger than the eventual production unit. Consequently, after the software code has been established, the substrate designer must then specifically design a substrate for the production unit, which will utilize the microprocessor flip chip that dictates the production unit's conductor pattern.

Accordingly, a shortcoming of the above development process is the requirement that two separate substrates be designed for a single microprocessor-based product. Such a requirement adds significantly to the time required to arrive at a final production design for the product. Furthermore, the mounting features of an integrated circuit package which incorporates the product, as well as the mounting site within its ultimate working environment, cannot be determined until the size of the final production unit has been established. As a result, the final implementation of the product is further delayed until such considerations have been resolved.

From the above, it can be seen that it would be desirable if an electronic circuit board which employs a microprocessor flip chip could be developed without the requirement that a development unit be specially designed to accommodate an integrated circuit socket. Conventionally, to do so would require an emulator, such as a programmable, prepackaged integrated circuit, which corresponds in size and shape to the intended production flip chip for the circuit board. However, the prior art has generally been discouraged from seeking such a solution due to the extremely small size and the intricate configuration of a flip chip conductor pattern to which such an emulator would need to be connected.

Accordingly, what is needed is a method by which a suitable interconnecting device can be mated with the conductor pattern for a production flip chip on the substrate of an engineering development unit, so as to enable the unit to be tested and evaluated without requiring an integrated circuit socket to be present on the circuit board. Such an interconnecting device would serve to connect a microprocessor emulator to the unit to simulate a microprocessor, while various development tests and/or evaluations are performed. As a result, the engineering development unit could be designed to accommodate the production flip chip and its conductor pattern, so as to allow the design of a single substrate which can be used for both the development unit and the final production units.

SUMMARY OF THE INVENTION

It is an object of this invention to provide a method by which a microprocessor-based electronic product can be developed without the requirement that a development unit be specially designed to accommodate an integrated circuit socket to serve as a means for emulating a microprocessor during development testing.

It is a further object of this invention to provide a communications interconnect device through which a microprocessor emulator can be placed in communication with a flip chip conductor pattern of a circuit board.

It is another object of this invention to provide a method for connecting such a device to the flip chip conductor pattern, such that a reliable and durable electrical connection is achieved.

In accordance with a preferred embodiment of this invention, these and other objects and advantages are accomplished as follows.

According to the present invention, there is provided an interconnect device for enabling communications between a circuit board and a microprocessor emulator, so as to permit the evaluation or testing of an electronic circuit or system without a microprocessor flip chip being present on the board. More particularly, the interconnect device serves to electrically connect the emulator to the individual circuit conductors which compose a flip chip conductor pattern formed on the circuit board. Also in accordance with this invention, a method is taught by which the interconnect device is soldered to the microprocessor conductor pattern on the circuit board. The interconnect device and the method are both specifically adapted to accommodate extremely small and intricate flip chip conductor patterns, so as to achieve a reliable communication path between the emulator and the circuit board.

Generally, the interconnect device includes a flexible substrate having an interconnect end and an oppositely disposed end to which an emulator can be connected. A number of conductors are supported by the flexible substrate, and extend its entire length. The number of conductors will preferably correspond to the number of circuit conductors which constitute the microprocessor conductor pattern on the circuit board. The conductors of the flexible interconnect device each terminate with a cantilevered portion, or conductor finger, which extends beyond the flexible substrate. The conductor fingers form a complementary conductor pattern to the microprocessor conductor pattern on the electronic circuit.

The complementary conductor pattern is configured such that, upon being mated with the conductor pattern on the circuit board, each of the conductor fingers will be in electrical communication with a corresponding one of the circuit conductors of the microprocessor conductor pattern. A device which is capable of emulating a microprocessor, such as an erasable, programmable read only memory (EPROM) device, can then be connected to the flexible substrate using any suitable device, such as a leaded, packaged integrated circuit socket or a male/female connector.

The method by which the flexible interconnect device of this invention is soldered to the microprocessor conductor pattern on the circuit board results in reliable communications between the emulator and the circuit board. More specifically, electrical shorts between adjacent conductors are avoided, and sufficient stress relief is provided so as to allow the flexible interconnect device and circuit board to be readily handled as a unit without premature fatiguing or otherwise breaking of the conductor fingers of the interconnect device.

The soldering process includes aligning the flexible interconnect device's complementary conductor pattern with the conductor pattern on the circuit board, such that the individual conductor fingers are precisely aligned with the individual conductors of the microprocessor conductor pattern. A suitable soldering device, such as a reflow soldering apparatus, is then brought into engagement with the conductor fingers, and soldering is performed such that reliable continuity between mating conductors is assured, while inadvertent contact between adjacent conductors is avoided so as to alleviate electrical shorting.

Using the flexible interconnect device of this invention, a circuit board and its associated electronic components may be extensively tested and evaluated without requiring an integrated circuit socket to be physically present on the board. Accordingly, an electronic circuit board which employs a microprocessor flip chip can be designed to incorporate the conductor pattern for the application's production flip chip, instead of being specially designed to accommodate an integrated circuit socket which is necessary only for development purposes. As a result, a single substrate can be designed for both the development unit and the final production units, so as to save time and materials during the development of the microprocessor-based product.

In addition, because a microprocessor is not present on the circuit board, the failure of the circuit board during testing results only in the scrappage of the board and its components, and not a microprocessor chip. As a result, potentially significant savings can be realized by avoiding the scrappage of presumably faultless microprocessor chips during development testing. The present method of this invention can also be adapted for use with production diagnostics and hot testing of circuit boards.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings wherein.

DETAILED DESCRIPTION OF THE INVENTION

A flexible circuit interconnect device is provided for establishing electronic communications between the electronic circuit components of a circuit board and a microprocessor emulator, so as to permit the evaluation or testing of the electronic circuit or system without a microprocessor chip being present on the circuit board. The flexible circuit interconnect device serves to electrically connect the emulator to an array of individual conductors which form a conductor pattern on the circuit board for a microprocessor flip chip.

Figure 1:
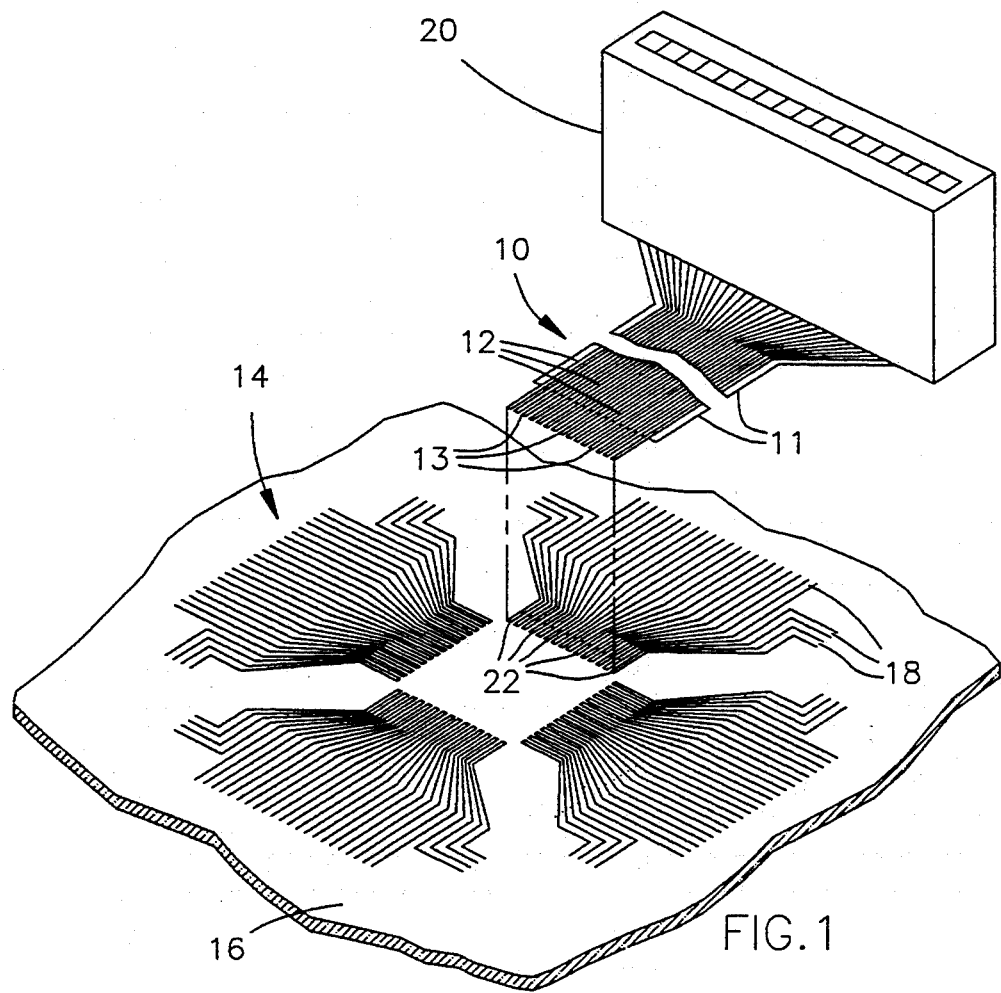
FIG. 1 shows, in perspective, a flip chip microprocessor conductor pattern formed on the surface of a circuit board, and a flexible circuit interconnect device in accordance with this invention.

Referring to FIG. 1, a flexible circuit interconnect 10 in accordance with this invention is shown. The circuit interconnect 10 is illustrated as being aligned with one side of a conventional flip chip conductor pattern 14 formed on the surface of a circuit board 16. In accordance with a preferred aspect of this invention, the circuit board 16 is an engineering development unit for a microprocessor-based product. As is conventional, the circuit board 16 may be a ceramic substrate or a printed wiring board. The conductor pattern 14 is composed of a number of conductors 18 which are sized and spaced so as to mate with the microprocessor flip chip to be used in the production version of the particular product.

For illustrative purposes, the circuit interconnect 10 is shown in FIG. 1 as being adapted to interconnect with only one series of conductors 18 of the conductor pattern 14. However, those skilled in the art will recognize that a more preferred interconnect device will communicate with all of the conductors 18 of the conductor pattern 14. Such an embodiment is illustrated in FIG. 4, and will be discussed below.

The circuit interconnect 10 is shown as a flexible flat cable which includes a flexible insulating base substrate 11 on which a number of parallel conductors 12 are supported. The substrate 11 may be of any suitable material, such as a polyimide or mylar film, and formed with or without cover layers. The circuit interconnect 10 may be single or double sided, multi-layered or rigidized, in addition to other possible arrangements. The circuit interconnect 10 has oppositely disposed ends, one of which terminates with the conductors 12 being cantilevered beyond the substrate 11, so as to form a corresponding number of conductor fingers 13. The opposite end of the circuit interconnect 10 is adapted to be fitted with a suitable connector depending on the particular application, such as the male/female connector 20 shown in FIG. 1, or a leaded packaged integrated circuit socket for a programmable prepackaged integrated circuit, as well as other configurations.

The conductors 12 may be formed on the substrate 11 by several methods, such as by laminating copper foil to any of several base substrate materials, or, alternatively, by selectively pattern plating copper directly onto the substrate 11. Preferably, the conductor finger 13 for each conductor 12 is plated with gold or pre-tinned with a suitable tin-lead alloy so as to enhance the solderability of the conductor fingers 13 to the conductors 18 of the conductor pattern 14. The conductor fingers 13 are arranged such that they form a pattern which is complementary to the conductor pattern 14 formed on the circuit board 16, and such that each conductor finger 13 will appropriately mate with a corresponding conductor 18 of the conductor pattern 14. A typical width for the conductor fingers 13 is about 0.005 to about 0.007 inch, and a typical spacing between conductor fingers 3 is about 0.007 to about 0.009 inch. The length of the conductor fingers 13, corresponding to the distance each conductor 12 is cantilevered beyond the end of the substrate 11, is preferably about 0.025 to about 0.030 inch. These dimensions may vary widely depending on the particular application.

Figure 4:
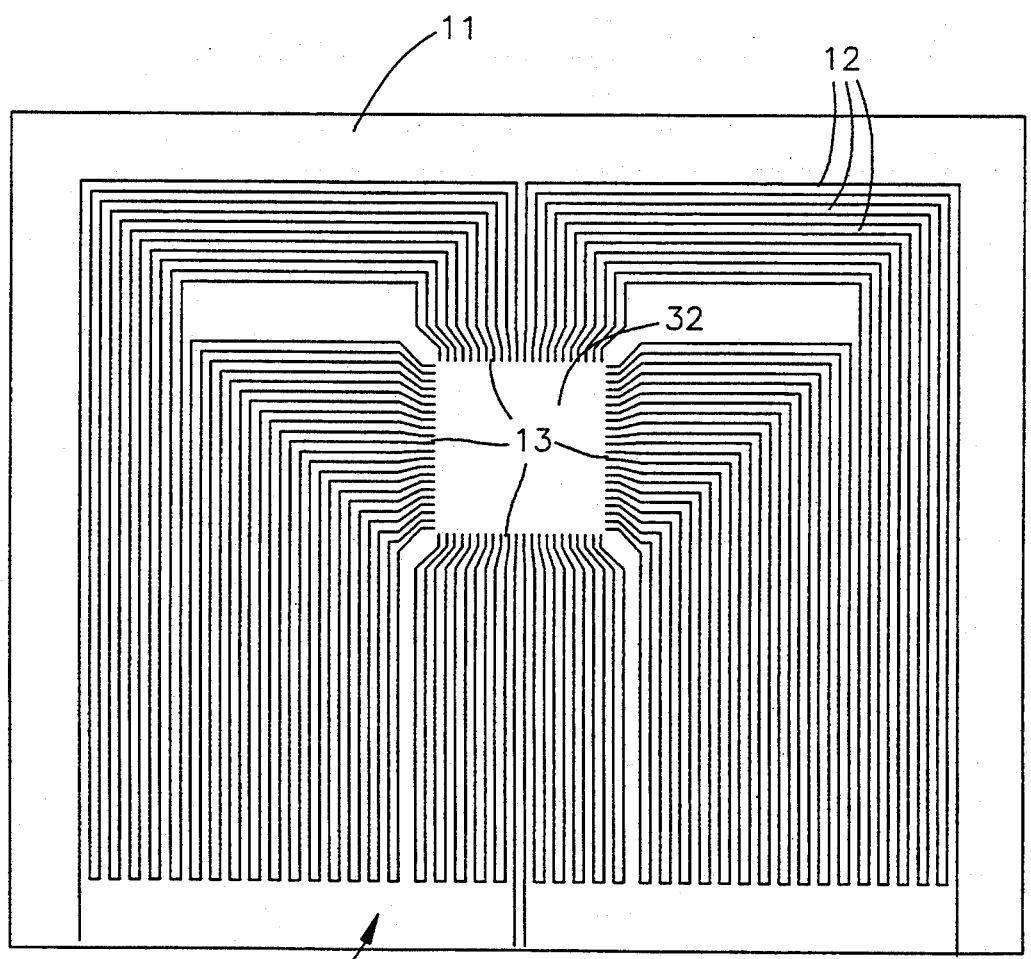
FIG. 4 is a plan view of a flexible circuit interconnect device immediately after being soldered to a flip chip conductor pattern in accordance with this invention.

With reference to FIG. 4, a preferred configuration for the circuit interconnect 10 is shown. Because a conventional conductor pattern on a circuit board is generally configured as shown in FIG. 1, the circuit interconnect 10 of this invention is preferably formed with an aperture 32, into which each of the conductor fingers 13 project as shown. The aperture 32 is essentially square-shaped such that the each conductor finger 13 can be simultaneously aligned with a corresponding one of the conductors 18 of the conductor pattern 14. Typically, the aperture 32 will measure a few millimeters per side, corresponding to the typical size of a microprocessor flip chip.

As can be seen from FIG. 4, the relatively small dimensions of and spacing between the individual conductor fingers 13 and conductors 18 necessitates an extremely intricate bonding process. Specifically, the bonding process must ensure that each conductor 18/conductor finger 13 pairing is provided with a sufficient amount of an electrically conductive bonding material so as to form a reliable conduction path. Simultaneously, a minimal amount of bonding material must be used so as to avoid creating an inadvertent electrical short between adjacent pairs of conductor fingers 13 or conductors 18. To afford such control, the bonding material must be precisely deposited, and the positions of the conductor fingers 13 relative to their corresponding conductors 18 must be closely controlled to ensure that the conductor fingers 13 are brought into contact with the bonding compound without laterally forcing the bonding compound into contact with an adjacent conductor finger 13 or conductor 18.

Figure 2:
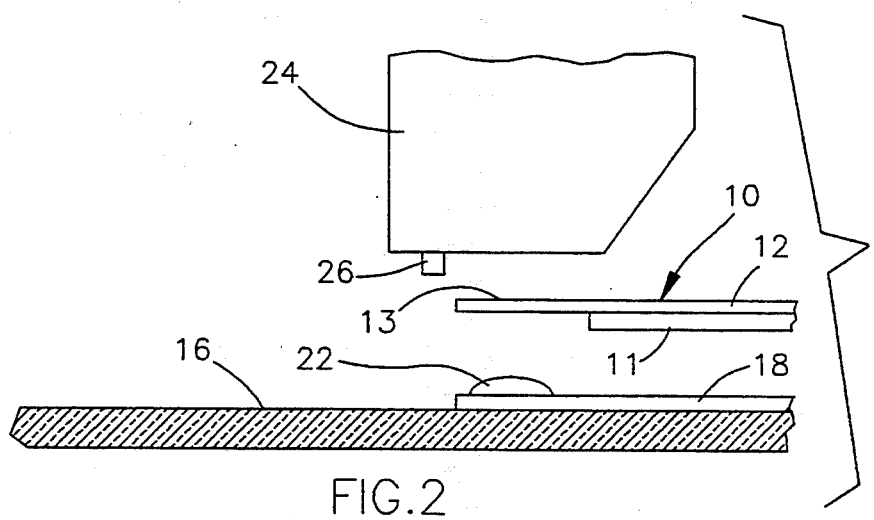
FIG. 2 is a cross-sectional view of the flexible circuit interconnect device of FIG. 1 immediately prior to being bonded to the circuit board.
Figure 3:
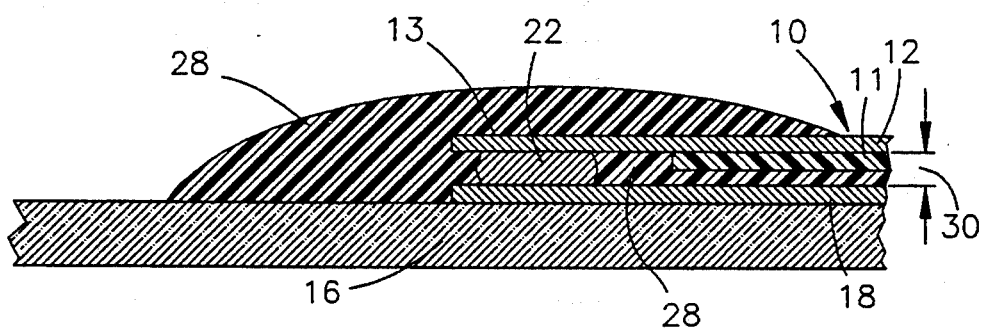
FIG. 3 is a cross-sectional view of the flexible circuit interconnect device of FIG. 1 immediately after being bonded to the circuit board.

The preferred method for bonding the conductor fingers 13 and conductors 18 is a solder reflow process using a solder paste composed of a binder, such as a flux compound, and a suitably conductive solder alloy, such as a 25/75 percent tin-lead alloy. An appropriate amount of solder paste is preferably screen printed onto each of the conductors 18. As an example, for conductors 18 having a width of about 0.006 inch and spaced apart about 0.008, a 0.006 by 0.016 inch quantity of solder paste is preferably deposited on each conductor 18 to a thickness of no more than about 0.006 inch. The solder paste is then melted so as to volatilize the binder and melt the solder alloy, such that the resulting solder 22 is appropriately distributed over the surface of each conductor 18, as illustrated in FIGS. 1 and 2. Preferably, this step is carried out using a reflow technique which locally heats the solder paste to a temperature above the melting point of the solder alloy. Using the preferred tin-lead alloy, the solder paste is preferably heated using an infrared oven to a temperature of about 215° C. to about 225° C. for a duration of about 5 to about 10 seconds.

The solder 22 is allowed to resolidify, and the circuit interconnect 10 is then brought into position over the conductor pattern 14. Because of the extremely intricate and delicate nature of the conductor fingers 13 and the conductors 18, a microscope is preferably used to accurately align the circuit interconnect 10 with the conductor pattern 14, with the conductor fingers 13 being positioned directly above the conductors 18. Once aligned, a hot bar reflow device, or thermode, 24 is simultaneously brought into engagement with each, or at least a portion, of the conductor fingers 13, such that each conductor finger 13 contacts its corresponding conductor 18 on the conductor pattern 14. The thermode 24 then heats the conductor fingers 13 and the solder 22 so as to reflow the solder 22 and metallurgically bond the conductor fingers 13 to their respective conductors 18. The thermode may contact all of the conductors 13 concurrently so as to metallurgically bond all of them simultaneously, or a portion of the conductors 13, such as all of the conductors 13 along a particular side, or any combination of the conductors 13 individually or collectively depending on the particular application.

A suitable reflow temperature cycle involves preheating the thermode 24 to a temperature of about 275° C. for about 6 seconds, ramping the temperature up to about 450° C. over a period of about 25 seconds, maintaining this temperature for about 10 seconds so as to reflow the solder 22 and metallurgically bond the conductor fingers 13 to their respective conductors 18, and then cooling the thermode 24 to a temperature of about 130° C. While the above reflow cycle has been found to achieve suitable results, those skilled in the art will recognize that a preferred temperature cycle for a given application will depend at least in part on the size of the substrate 11, as well as other factors. Accordingly, the actual temperatures and durations employed during the reflow process when practicing this invention may vary significantly from those provided above.

To limit the amount of solder 22 which will extrude from beneath the conductor fingers 13, a stand-off 26 is provided on the lower surface of the reflow device 24. For the conductor pattern geometry described above, the stand-off 26 preferably projects about 0.004 inch below the lower surface of the reflow device 24, such that the resulting solder joint has a vertical height of about 0.004 inch, and such that an approximately 0.004 inch gap 30 is created between the unsoldered portion of the conductor fingers 12 and the conductors 18.

In order to provide additional mechanical strength, an epoxy 28 is deposited over the conductor fingers 13. As a result, the potential for premature fatiguing due to thermal cycles, or otherwise breaking of the conductor fingers 13 when the circuit interconnect 10 and the circuit board 16 are handled, is significantly reduced.

Once interconnected in accordance with the above method, the flexible circuit interconnect 10 can be connected to a suitable microprocessor emulator, such as a programmable prepackaged integrated circuit (not shown), with the connector 20. Standard developmental testing can then be performed on the circuit board 16.

From the above, it can be seen that a significant advantage of this invention is that the circuit board 16 can be designed to incorporate the conductor pattern 14 for the application's production flip chip, instead of being specially designed to accommodate an integrated circuit socket which is necessary for development purposes only. Accordingly, a single substrate 11 can be designed for use in engineering development and production, resulting in a significant savings in time and materials during the development of the product. Furthermore, arriving at the final substrate design early within a development program enables the mounting features for the integrated circuit package which incorporates the product to be defined sooner, as well as the mounting site within the package's working environment. As a result, the time from when product development is initiated until final implementation of the product is achieved can potentially be significantly shorter than that possible before.

In addition, because a microprocessor chip is not physically present on the circuit board 16, failure of one of the electronic circuit components on the circuit board 16 during testing will, at worst, result in the scrappage of the circuit board 16, and not a presumably faultless microprocessor chip. As a result, potentially significant savings can be realized, since the microprocessor chip is generally the most expensive component on a circuit board. The present invention can also be adapted for use with production diagnostics and hot testing of circuit boards, where similar savings can potentially be realized.

Accordingly, while our invention has been described in terms of a preferred embodiment, it is apparent that other forms could be adopted by one skilled in the art, for example by modifying the processing parameters such as the temperatures or durations employed, or by substituting appropriate materials. Accordingly, the scope of our invention is to be limited only by the following claims.

The embodiments of the invention in which an exclusive property or privilege is claimed are defined as follows:

1. A method for interconnecting a microprocessor flip chip conductor pattern on an electronic circuit board with a remotely disposed microprocessor emulator, said method comprising the steps of:

providing said electronic circuit board to have a plurality of circuit conductors formed thereon, said plurality of circuit conductors defining said microprocessor flip chip conductor pattern;

providing means for communicating between said remotely disposed microprocessor emulator and said plurality of circuit board conductors, said communicating means comprising a plurality of conductors which define a complementary flip chip conductor pattern to said microprocessor flip chip conductor pattern on said electronic circuit board;

bonding said complementary flip chip conductor pattern to said microprocessor flip chip conductor pattern such that each of said plurality of conductors is placed in electrical communication with a corresponding one of said plurality of circuit conductors of said microprocessor flip chip conductor pattern; and placing said remotely disposed microprocessor emulator in electrical communication with said communicating means so as to permit said remotely disposed microprocessor emulator to communicate with said electronic circuit board through said microprocessor flip chip conductor pattern.

2. A method as recited in claim 1 wherein said step of providing means for communicating between said microprocessor emulator and said plurality of circuit conductors includes providing a flexible substrate for supporting said plurality of conductors.

3. A method as recited in claim 1 wherein said step of bonding said complementary flip chip conductor pattern to said microprocessor flip chip conductor pattern includes soldering each of said plurality of conductors to a corresponding one of said plurality of circuit conductors of said microprocessor flip chip conductor pattern.

4. A method as recited in claim 1 wherein said step of bonding said complementary flip chip conductor pattern to said microprocessor flip chip conductor pattern comprises:

screen printing a solder paste onto each of said plurality of circuit conductors of said microprocessor flip chip conductor pattern;

aligning each of said plurality of conductors with a corresponding one of said plurality of circuit conductors; and reflow soldering each of said plurality of conductors to a corresponding one of said plurality of circuit conductors.

5. A method as recited in claim 1 further comprising the step of screen printing a tin-lead solder paste on each of said plurality of circuit conductors prior to said bonding step.

6. A method as recited in claim 1 further comprising the step of applying an epoxy to a joint formed when said complementary flip chip conductor pattern is bonded to said microprocessor flip chip conductor pattern.

7. A method as recited in claim 1 wherein said step of bonding said complementary flip chip conductor pattern to said microprocessor flip chip conductor pattern comprises reflow soldering each of said plurality of conductors to a corresponding one of said plurality of circuit conductors with a hot bar reflow device.

8. A method for testing an electronic circuit board having a microprocessor flip chip conductor pattern formed thereon, said method comprising the steps of:
   providing said electronic circuit board with a plurality of circuit conductors which define said microprocessor flip chip conductor pattern, said microprocessor flip chip conductor pattern being complementary to terminal locations on a microprocessor flip chip;
   providing means for communicating between a remotely disposed microprocessor emulator and said plurality of circuit conductors, said communicating means comprising a plurality of conductors supported by a flexible substrate, said plurality of conductors forming a communications path for each of said plurality of circuit conductors of said microprocessor flip chip conductor pattern, each of said plurality of conductors terminating in a cantilevered conductor finger which extends beyond one end of said flexible substrate, said cantilevered conductors fingers defining a complementary flip chip conductor pattern to said microprocessor flip chip conductor pattern on said electronic circuit board;
   aligning said complementary flip chip conductor pattern to said microprocessor flip chip conductor pattern such that each of said cantilevered conductor fingers is aligned with a corresponding one of said plurality of circuit conductors of said microprocessor flip chip conductor pattern;
   soldering each of said cantilevered conductor fingers with said corresponding one of said plurality of circuit conductors so as to place said microprocessor flip chip conductor pattern in electrical communication with said complementary flip chip conductor pattern of said communicating means; and
   emulating said microprocessor flip chip with said remotely disposed microprocessor emulator through said communicating means while concomitantly testing said electronic circuit board.

9. A method as recited in claim 8 wherein said step of soldering comprises:
   screen printing a solder paste onto each of said plurality of circuit conductors of said microprocessor flip chip conductor pattern;
   aligning each of said cantilevered conductor fingers with a corresponding one of said plurality of circuit conductors; and
   reflow soldering each of said cantilevered conductor fingers to a corresponding one of said plurality of circuit conductors, 10. A method as recited in claim 8 further comprising the step of screen printing a tin-lead solder on each of said plurality of circuit conductors prior to said soldering step.

11. A method as recited in claim 8 further comprising the step of applying epoxy to a solder joint formed when said complementary flip chip conductor pattern is soldered to said microprocessor flip chip conductor pattern, 12. A method as recited in claim 8 wherein said step of soldering comprises reflow soldering each of said cantilevered conductor fingers to a corresponding one of said plurality of circuit conductors with a hot bar reflow device, 13. A method as recited in claim 12 wherein said step of soldering comprises controlling the height of a solder joint formed thereby.

* * * * *